United States Patent [19]
Irie et al.

[11] Patent Number: 5,825,196
[45] Date of Patent: Oct. 20, 1998

[54] METHOD FOR DETECTING DEFECTS IN AN ACTIVE MATRIX LIQUID CRYSTAL DISPLAY PANEL

[75] Inventors: Katsumi Irie, Kashihara; Nobuyuki Kawase, Tenri; Takafumi Hayama, Tenri; Touko Kasahara, Tenri, all of Japan

[73] Assignee: Sharp Kabushiki Kaisha, Osaka, Japan

[21] Appl. No.: 739,760

[22] Filed: Oct. 29, 1996

[30] Foreign Application Priority Data

Oct. 31, 1995 [JP] Japan .................................. 7-284157

[51] Int. Cl.⁶ .................................................. G01R 31/00
[52] U.S. Cl. ............................................. 324/770; 345/92
[58] Field of Search .......................... 324/770, 158.1; 345/50, 55, 94, 92; 349/192

[56] References Cited

U.S. PATENT DOCUMENTS

| | | | |
|---|---|---|---|
| 5,113,134 | 5/1992 | Plus et al. | 324/770 |
| 5,444,390 | 8/1995 | Bartlett et al. | 324/770 |
| 5,546,013 | 8/1996 | Ichioka et al. | 324/770 |
| 5,608,558 | 3/1997 | Katsumi | 324/770 |

FOREIGN PATENT DOCUMENTS 7-5481  1/1995  Japan .

Primary Examiner—Ernest F. Karlsen
Assistant Examiner—Anh Phung
Attorney, Agent, or Firm—Nixon & Vanderhye P.C.

[57] ABSTRACT

Disclosed herein is a method for detecting a defect of an active matrix liquid crystal panel, the method including a step of inputting a data signal for displaying an image having a luminance level lower than a maximum luminance level to a first signal line while inputting a data signal for displaying a black image to a second signal line and a third signal line, the second signal line and the third signal line adjoining the first signal line, thereby causing pixels corresponding to the first signal line to display a single color. According to the method of the present invention, any defective pixel is displayed darker than normal, owing to a decrease in the transmittance, so that point defects such as S-D leak defects can be easily detected.

7 Claims, 7 Drawing Sheets

METHOD FOR DETECTING DEFECTS IN AN ACTIVE MATRIX LIQUID CRYSTAL DISPLAY PANEL

BACKGROUND OF THE INVENTION

1. Field of the Invention

The present invention relates to a method for detecting defects in an active matrix liquid crystal panel, e.g., especially that used as a display device for a computer, a word processor, or the like.

2. Description of the Related Art

In recent years, flat display panels incorporating liquid crystal or the like as display media have gained much prevalence as display devices for computers, word processors, and the like. Active matrix liquid crystal panels are particularly likely to be used as display panels having high resolutions, e.g., VGA, S-VGA, or XGA, and including a very large number of display pixels.

An active matrix liquid crystal panel typically includes an active matrix substrate opposing a counter substrate having counter electrodes thereon, with a liquid crystal layer interposed between the two substrates. The active matrix substrate further includes a matrix consisting of a plurality of pixel electrodes and switching elements for driving the pixel electrodes, the matrix being provided on an insulating substrate, where each switching element is connected to a corresponding pixel electrode. Scanning lines and signal lines are formed on the active matrix substrate so as to intersect each other.

FIG. 4 is an equivalent circuit diagram showing a conventional active matrix liquid crystal panel. The active matrix substrate of this conventional liquid crystal panel includes, for example, scanning lines 1, scanning line terminals 1a, signal lines 2, signal line terminals 2a, common lines 3, a common line terminal 3a, TFTs (thin film transistors) 4, and pixel electrodes 5 provided on a glass substrate. The scanning lines 1 and the signal lines 2 are provided so as to intersect each other with an insulating film (not shown) interposed therebetween. At each intersection of the scanning lines 1 and the signal lines 2 is provided a corresponding TFT 4 functioning as a switching element. A gate electrode 6, a source electrode 7, and a drain electrode 8 of each TFT 4 are connected to a corresponding scanning line 1, a corresponding signal line 2, and a corresponding pixel electrode 5, respectively. The common lines 3 are provided in parallel to the respective scanning lines 1 so as to intersect the respective signal lines 2 for supplying data signals with an insulating film interposed therebetween. The common lines 3 are short-circuited with one another at the common line terminal 3a. Furthermore, a number of redundant lines 9 (e.g., two in FIG. 4) are provided in parallel to the scanning lines 1. A redundant line terminal 9a is provided at each end of each redundant line 9. The redundant lines 9 are provided as an aid for fixing any possible disruptions of the signal lines 2 and the scanning lines 1, which are formed as very thin lines especially in the case where the active matrix liquid crystal panel is a high-definition active matrix liquid crystal panel. The redundant lines 9 are disposed so as to intersect the signal lines 2 with the above-mentioned insulating film interposed therebetween. Reference numeral 11 in FIG. 4 represents a pixel capacitance existing between each pixel electrode 5 and a counter substrate (not shown), wherein a liquid crystal is interposed therebetween. A predetermined potential is supplied to a counter electrode 17 provided on the counter substrate. Reference numeral 12 in FIG. 4 represents an auxiliary capacitance existing between each pixel electrode 5 and the corresponding auxiliary capacitance line (i.e., common line 3).

When the active matrix liquid crystal panel having the above configuration is required to have a high resolution, e.g., VGA, S-VGA, or XGA, the signal lines 2, the scanning lines 3, and their respective terminals inevitably have very small pitches. Therefore, there has been a difficulty in detecting defects in any produced active matrix liquid crystal panel by using a pin probe, which must be brought into contact with a terminal of interest. Specifically, it has been difficult to bring the pin probe into contact with only an intended one of two or more adjoining terminals where the terminals are formed with a small pitch.

FIG. 5 is an enlarged view showing signal line terminals 2a of an active matrix substrate of an active matrix liquid crystal panel. As shown in FIG. 5, a short bar 24 is generally provided in an active matrix liquid crystal panel for short-circuiting all the signal line terminals 2a of the signal lines for the purpose of detecting any defects occurring in the liquid crystal panel. According to this conventional method for detecting defects, in the case of a liquid crystal panel of a normally-white mode (in which application of no voltage results in a white display mode), the same data signal is supplied to all the signal lines 2 so that a uniform black image is expected to be displayed over all the display. As a result, any defective portion would display a spot of either white, red, green, or blue.

Japanese Laid-Open Patent Publication No. 7-5481 discloses a method for detecting defects in a color active matrix liquid crystal panel. This defect detection method proposes the use of three short bars for the signal lines: two short bars receiving a data signal shown in FIG. 6 and one short bar receiving a signal at 0V (or the GND level). Specifically, a GND level signal is supplied to the signal lines to display red, while an AC signal of a predetermined voltage level is supplied to all the other signal lines, so that one third of all the pixels display red. Next, the same process is repeated to display green. Finally, the same process is repeated to display blue.

When conducting the display in the above-mentioned manner, any unintended displayed image (i.e., any image occurring in positions other than the intended positions) or any intended image displayed in a different color (i.e., from the rest of the pixels in the intended position) indicates the presence of a defect in that position, which can be detected by eyesight.

Point defects may occur due to short-circuiting between various positions, e.g., (1) between a pixel electrode and a signal line connected to the pixel electrode via a TFT (hereinafter referred to as "the pixel electrode's own signal line"), as exemplified in a S-D leak defect between the source electrode (S) and the drain electrode (D) of a TFT 4 in FIG. 7; or (2) between a pixel electrode and a signal line which is not the pixel electrodes's own signal line.

The above-mentioned defect detection method can detect defects occurring due to the short-circuiting described in (1) based on the display of images in unintended positions and the display in unintended colors. However, the above-mentioned defect detection method cannot accurately detect defects occurring due to the short-circuiting described in (2) because, in the case where the liquid crystal panel is of a normally-white mode, supplying the same signal to both viable pixels and short-circuited pixels results in the same color (of black or any other predetermined color) displayed by those pixels alike.

SUMMARY OF THE INVENTION

A method for detecting a defect of an active matrix liquid crystal panel according to the present invention includes a step of inputting a data signal for displaying an image having a luminance level lower than a maximum luminance level to a first signal line while inputting a data signal for displaying a black image to a second signal line and a third signal line, the second signal line and the third signal line adjoining the first signal line, thereby causing pixels corresponding to the first signal line to display a single color.

In one embodiment of the invention, the data signal is input via three, or a multiple of three, test lines. The three, or multiple of three, test lines are disposed so as to intersect signal line extension portions of the first signal line and the second and third signal lines.

In another embodiment of the invention, the test lines are electrically connected to or disconnected from signal line extension portions in such a manner that each signal line extension portion is connected to only one of the test lines.

In still another embodiment of the invention, the voltage of the data signal for displaying the image having a luminance level lower than the maximum luminance level is greater than about 0 V and less than about ±3.5 V.

In still another embodiment of the invention, the voltage of the data signal for displaying the image having a luminance level lower than the maximum luminance level is in the range of about ±0.8 V to about ±2.0 V.

In still another embodiment of the invention, the active matrix liquid crystal panel is a color active matrix liquid crystal panel.

In still another embodiment of the invention, the defect is a S-D leak defect occurring between a pixel electrode and the pixel electrode's own signal line, or a point defect occurring due to the pixel electrode being short-circuited with a signal line other than the pixel electrode's own signal line.

As described above, according to the present invention, a data signal for displaying an image at a luminance level lower than the maximum luminance level is supplied to a first signal line of an active matrix liquid crystal panel. Concurrently, a data signal for displaying a black image is supplied to second and third signal lines adjoining the first signal line so that the pixels receiving the data signal via the first signal line display a single color. This process is also performed with respect to the second and third signal lines of each set of three adjoining signal lines, so that all the pixels (i.e., the pixels associated with the first signal line, the pixels associated with the second signal line, and the pixels associated with the third signal line) experience displaying a single color. Since the pixels which are expected to display a single color have a luminance level lower than the maximum luminance level, any defective pixel has a transmittance lower than that of viable pixels, thereby appearing darker than the viable pixels. As a result, the defective pixels can be easily detected by eyesight. Furthermore, by leaving a mark in the vicinity of any such defects, the defects can be easily confirmed in a subsequent close examination using a microscope or the like.

Moreover, the data signal can be efficiently supplied to predetermined signal lines in the above process by providing a signal line extension portion for every signal line and providing three (or a multiple of three) test lines so as to intersect the signal line extension portions in such a manner that:

(1) preferably, the above-mentioned data signals are supplied via the test lines so as to cause pixels associated with the first signal line to display a single color and cause pixels associated with the second and third signal lines adjoining the first signal line to display black; and (2) more preferably, the test lines are electrically connected to/disconnected from the signal line extension portions in such a manner that each signal line extension portion is connected to only one of each set of three (or multiple of three) test lines.

Thus, the invention described herein makes possible the advantages of: (1) providing a method for detecting defects in an active matrix liquid crystal panel that enables the detection of point defects due to S-D leak defects; and (2) providing a method for detecting defects in an active matrix liquid crystal panel that enables the detection of point defects due to short-circuiting between a pixel electrode and a signal line other than the pixel electrodes's own signal line, point defects due to any foreign object present in the liquid crystal panel, and display unevenness due to non-uniform thickness of a color filter in the liquid crystal panel; and (3) providing a method for detecting defects in an active matrix liquid crystal panel that improves the quality and reliability of the subject active matrix liquid crystal panels by preventing defective products from being marketed.

These and other advantages of the present invention will become apparent to those skilled in the art upon reading and understanding the following detailed description with reference to the accompanying figures.

DESCRIPTION OF THE PREFERRED EMBODIMENTS

Figure 1:
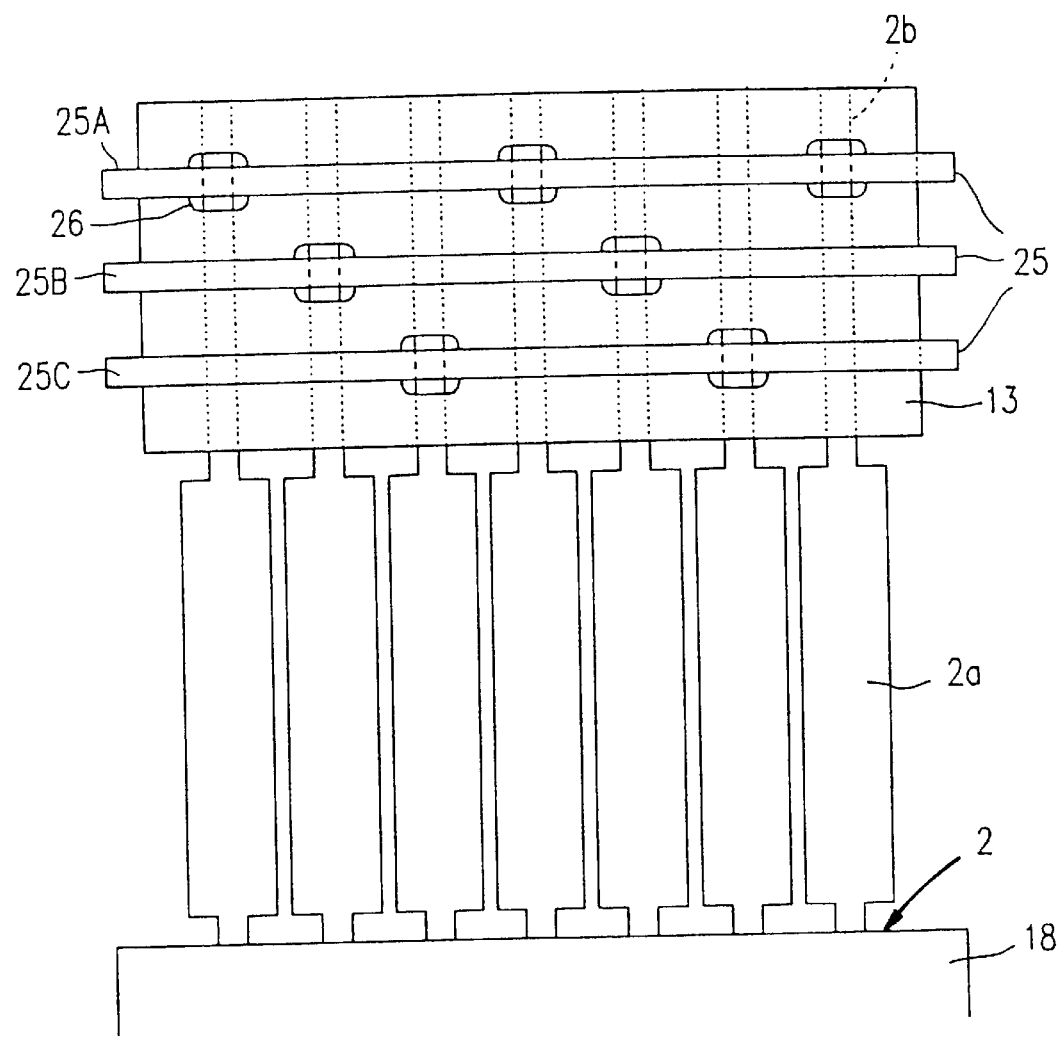
FIG. 1 is a front view showing a color active matrix liquid crystal panel, illustrating an exemplary active matrix liquid crystal panel for the present invention.

Hereinafter, an example of the present invention will be described with reference to the accompanying figures. However, it will be appreciated that the present invention is not to be limited to the example. In the figures, component elements having the same functions are indicated by the same reference numerals.

Figure 4:
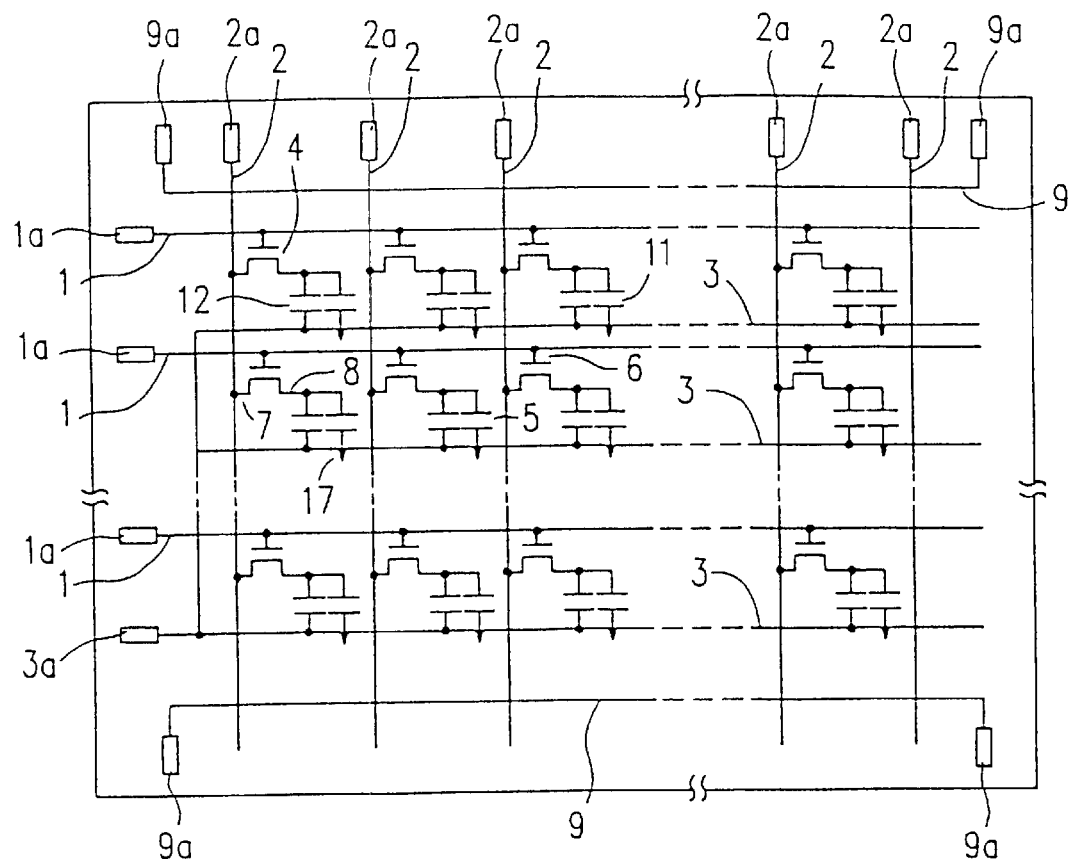
FIG. 4 is an equivalent circuit diagram illustrating a conventional active matrix substrate.
Figure 5:
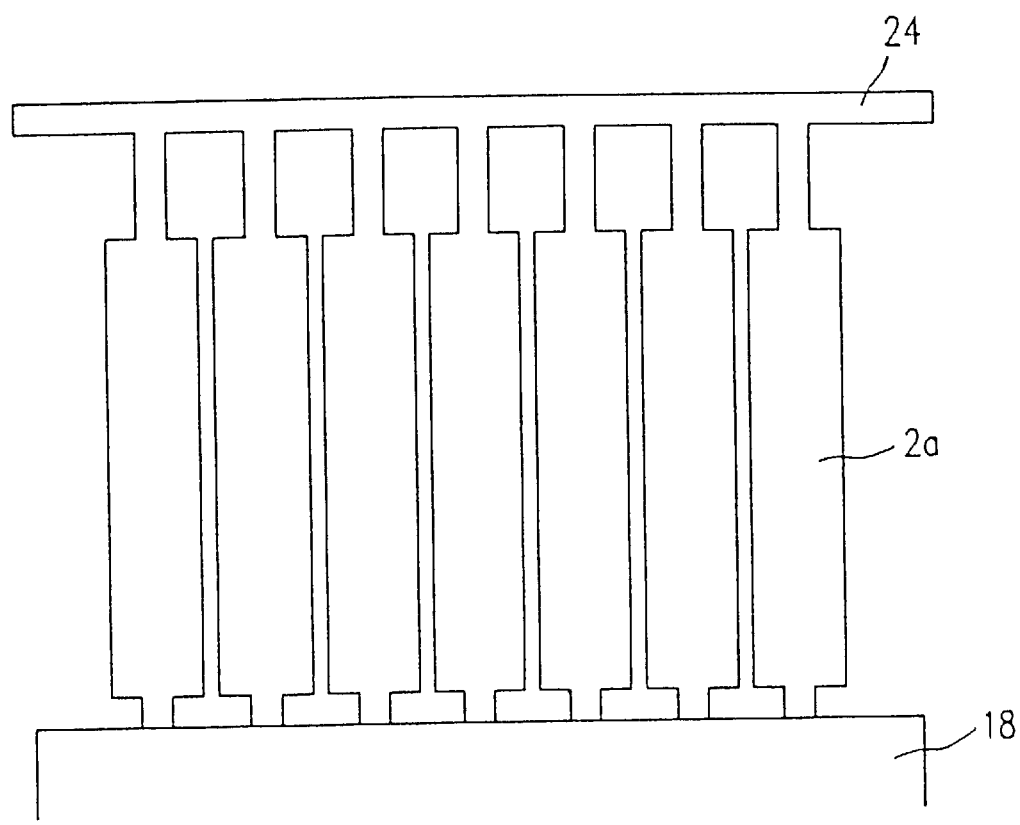
FIG. 5 is a partially enlarged view showing signal line terminals of an active matrix substrate to be subjected to a conventional defect detection method.
Figure 6:
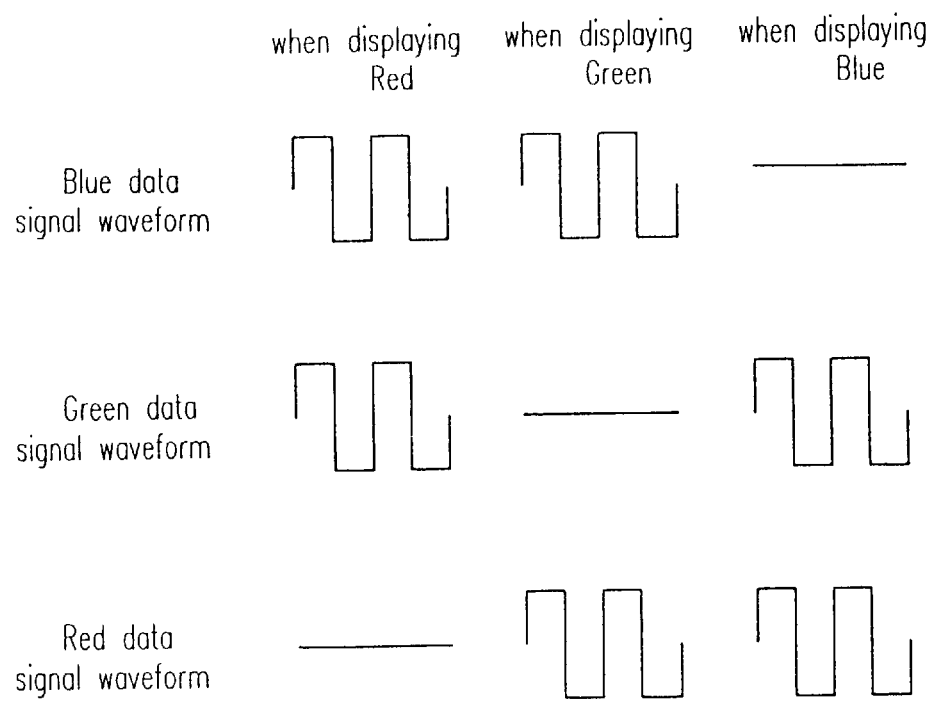
FIG. 6 is a schematic diagram showing exemplary waveforms of data signals to be applied to an active matrix liquid crystal panel by a conventional defect detection method.
Figure 7:
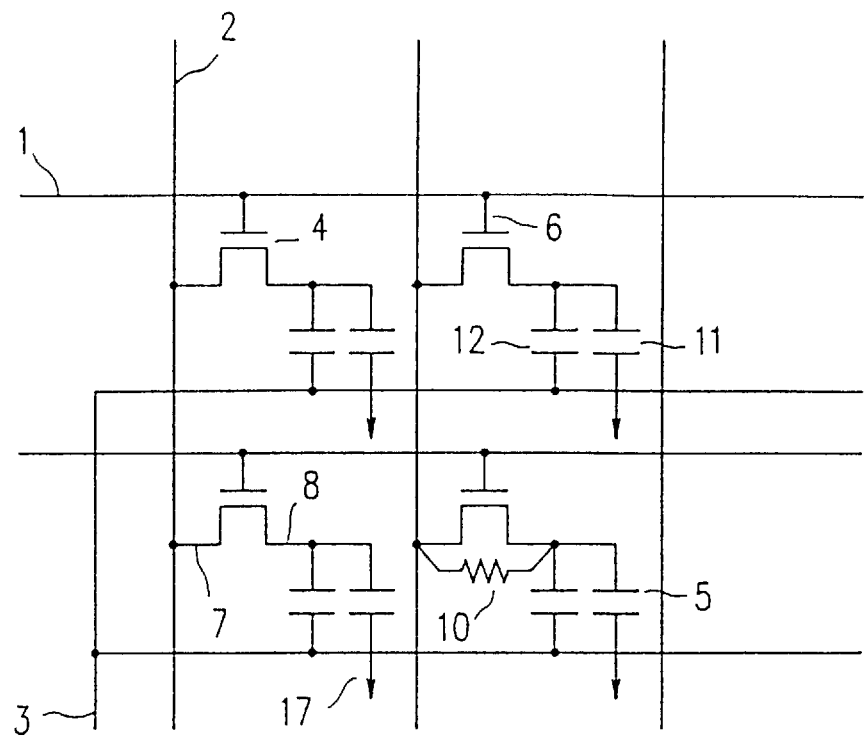
FIG. 7 is an equivalent circuit diagram illustrating a S-D leak defect of an active matrix liquid crystal panel.

FIG. 1 is a front view showing an essential portion of an exemplary color active matrix liquid crystal panel to be subjected to the method of the present invention. Otherwise the active matrix liquid crystal panel has a similar structure to that shown in FIG. 4.

As shown in FIG. 1, the active matrix liquid crystal panel to be subjected to the present invention includes a plurality of signal lines 2 each having a corresponding signal line terminal 2a. An extension portion 2b extends away from the display portion 18 of the liquid crystal panel of each signal line terminal 2a. An insulating film 13 is provided on the signal line extension portions 2b. On the insulating film 13 are provided three test lines 25A, 25B, and 25C intersecting the signal lines 2 at an angle, e.g., 90°. A plurality of through holes 26 are provided in portions of the insulating film 13 corresponding to intersections between the test lines 25A, 25B, and 25C and the signal line extension portions 2b. Each signal line extension portion 2b is connected to the test line 25A, 25B, or 25C via a corresponding through hole 26.

Thus, one through hole 26 is provided for an intersection of each signal line extension portion 2b and either the test line 25A, 25B, or 25C. Specifically, each signal line extension portion 2b receives one through hole 26, while each test line 25A, 25B, or 25C receives one through hole for every three signal line extension portions 2b. Herein, every three adjoining signal line extension portions 2b are employed for displaying three colors, i.e., R (red), G (green), and B (blue).

The present invention does not limit the number of test lines 25 to three. Alternatively, there may be a multiple of three (e.g., 6) test lines 25. In such cases, too, each signal line extension portion 2b receives one through hole 26, while each test line 25A, 25B, or 25C receives one through hole for every three signal line extension portions 2b.

The active matrix liquid crystal panel having the above structure is subjected to the method of detecting defects according to the present invention as follows. The below example describes a case where the three test lines 25A, 25B, and 25C, as illustrated in FIG. 1, are incorporated in the active matrix liquid crystal panel. It is assumed that the test lines 25A, 25B, and 25C are electrically connected to the signal lines 2 for displaying R (red), the signal lines 2 for displaying G (green), and the signal lines 2 for displaying B (blue), respectively.

Figure 2:
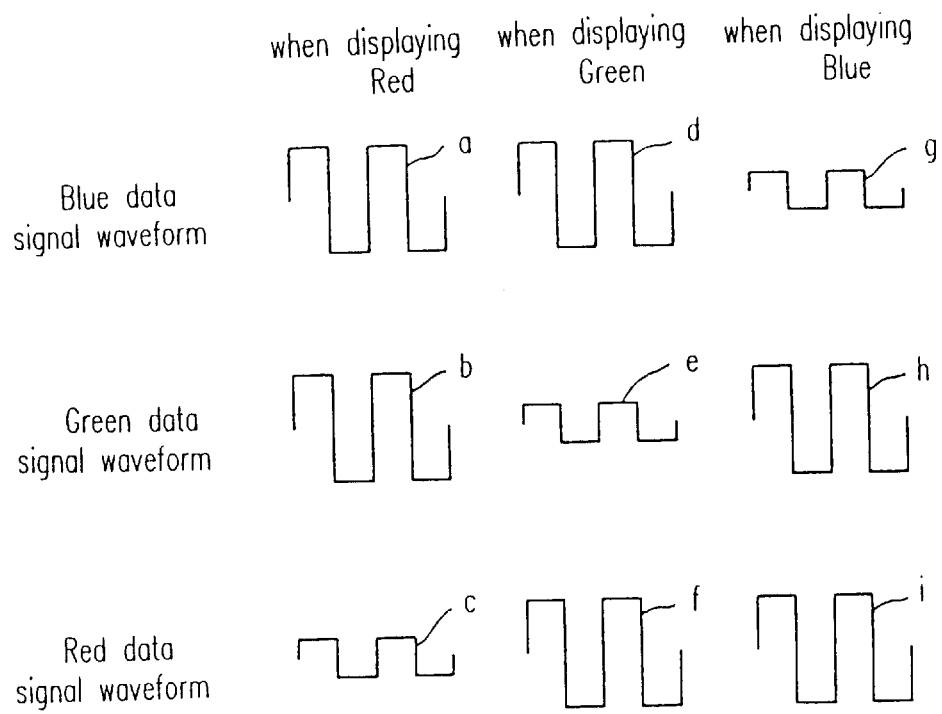
FIG. 2 is a schematic diagram showing exemplary waveforms of data signals to be applied to the active matrix liquid crystal panel according to the present invention.

FIG. 2 is a schematic diagram showing exemplary waveforms of data signals to be applied to the active matrix liquid crystal panel according to the present invention. First, data signals having two kinds of waveforms as shown in FIG. 2 are applied to the test lines 25A, 25B, and 25C so as to display a single color.

Figure 3:
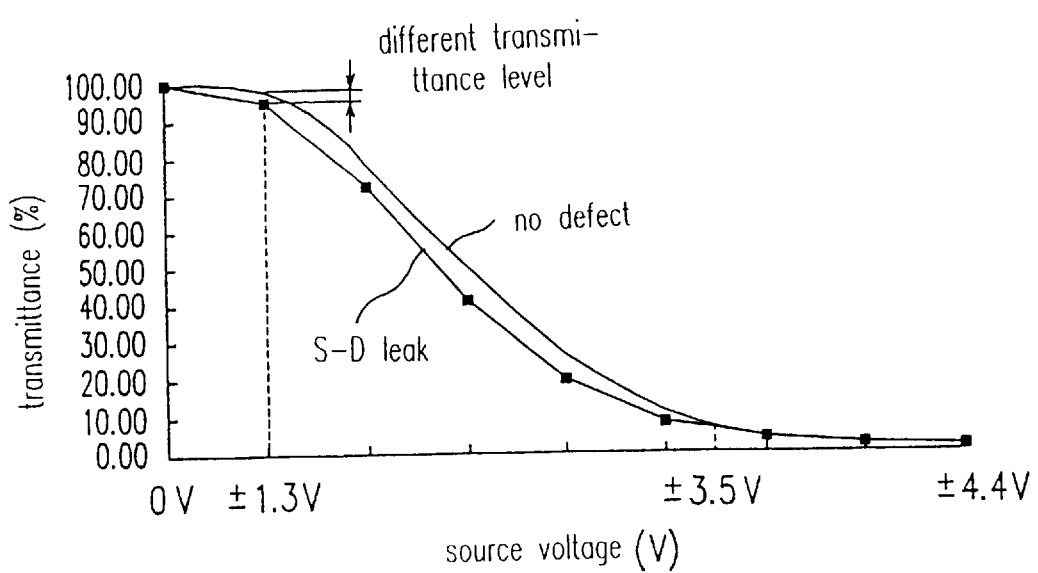
FIG. 3 is a graph illustrating the detection principle of the method of the present invention, indicative of a difference in transmittance between defective pixels (due to S-D leak) and viable pixels.

When detecting the defects in the active matrix liquid crystal panel while displaying a single color of red on the display, a Red data signal waveform c shown in FIG. 2 is applied to the test line 25A at ±1.3 V for obtaining a luminance level lower than the maximum luminance level; a Green data signal waveform b shown in FIG. 2 is applied to the test line 25B at ±4.4 V, for example; and a Blue data signal waveform a shown in FIG. 2 is applied to the test line 25C at ±4.4 V, for example. FIG. 3 shows the relationship between the source voltage and the transmittance (V-T characteristics) in this case. As shown in FIG. 3, when a source voltage of ±4.4V is applied to a test line, the transmittance of the active matrix liquid crystal panel becomes closer to 0 so that the corresponding pixels display black. On the other hand, when a source voltage of ±1.3 V corresponding to a luminance level lower than the maximum luminance level is applied to a test line, the corresponding pixels display red so that a uniform red image is expected to be displayed all over the active matrix liquid crystal panel.

Next, when detecting the defects in the active matrix liquid crystal panel while displaying a single color of green on the display, a Green data signal waveform e shown in FIG. 2 is applied to the test line 25B at ±1.3 V for obtaining a luminance level lower than the maximum luminance level; a Red data signal waveform f shown in FIG. 2 is applied to the test line 25A at ±4.4 V, for example; and a Blue data signal waveform d shown in FIG. 2 is applied to the test line 25C at ±4.4 V, for example. As a result, the pixels corresponding to the test line 25B display green and the pixels corresponding to the test lines 25A and 25C display black, so that a uniform green image is expected all over the active matrix liquid crystal panel.

Next, when detecting the defects in the active matrix liquid crystal panel while displaying a single color of blue on the display, a Blue data signal waveform g shown in FIG. 2 is applied to the test line 25C at ±1.3 V for obtaining a luminance level lower than the maximum luminance level; a Red data signal waveform i shown in FIG. 2 is applied to the test line 25A at ±4.4 V, for example; and a Green data signal waveform h shown in FIG. 2 is applied to the test line 25B at ±4.4 V, for example. As a result, the pixels corresponding to the test line 25C display blue and the pixels corresponding to the test lines 25A and 25B display black so that a uniform blue image is expected all over the active matrix liquid crystal panel.

The voltages to be applied in the above three steps are shown in Table 1 below.

TABLE 1

| Test image | | Uniform red | | | Uniform green | | | Uniform blue | | |
| --- | --- | --- | --- | --- | --- | --- | --- | --- | --- | --- |
| Source line | | R | G | B | R | G | B | R | G | B |
| Source voltage | | ±1.3 V | ±4.4 V | ±4.4 V | ±4.4 V | ±1.3 V | ±4.4 V | ±4.4 V | ±4.4 V | ±1.3 V |
| Counter voltage | Vcdc Vcac | Optimum value None | | | Optimum value None | | | Optimum value None | | |

By applying the above-described data signals, the defects, if any, can be detected over all the pixels of the active matrix liquid crystal panel. Specifically, as shown in FIG. 3, the application of the same voltage results in different transmittance levels depending on whether an S-D leak defect has occurred between a pixel electrode and the pixel electrode's own signal line or no defect has occurred at all. Thus, any pixel having an S-D leak defect can be detected by eyesight. Furthermore, if a point defect has occurred due to a pixel electrode being short-circuited with a signal line other than the pixel electrode's own signal line, such a point defect can be visibly detected based on the display of images in unintended positions and the display in unintended colors, as described above.

Once the above-mentioned defect detection process is complete, the signal line extension portions 2b are removed (e.g., by being cut away) at positions closer to the pixel side (i.e., the display region) than the test lines 25.

In the above-mentioned example, a data signal waveform of ±1.3 V is applied to the signal lines for displaying a uniform image of each single color while a data signal waveform of ±4.4V is applied to the signal lines for displaying black. However, the voltage of the data signal waveform to be applied to the signal lines for displaying a uniform image of each single color is not limited to ±1.3 V. The voltage to be applied to the signal lines can be any voltage as long as the application of the same voltage results in different transmittance levels depending on whether an S-D leak defect has occurred or no defect has occurred at all, as shown in FIG. 3. Specifically with reference to the characteristics shown in FIG. 3, a voltage which is higher than 0 V, corresponding to the maximum luminance level, and smaller than about ±3.5 V is selected as the above-mentioned voltage. Preferably, the voltage of the data signal corresponding to a luminance level lower than the maximum luminance level is selected to be a value in the range of about ±0.8 V to about ±1.3 V so as to ensure a difference of about 5% or more in the transmittance level for facilitating the detection by eyesight. More preferably, the voltage of the data signal corresponding to a luminance level lower than the maximum luminance level is selected to be a value in the range of about ±1.3 V to about ±2.0 V so as to ensure a difference of about 10% or more in the transmittance level for further facilitating the detection by eyesight.

Although the above example illustrates the detection of an S-D leak defect (occurring between a pixel electrode and the pixel electrode's own signal line) and a point defect (occurring due to a pixel electrode being short-circuited with a signal line other than the pixel electrodes's own signal line), the defects to be detected by the method of the present invention are not limited to only such defects. For example, a point defect occurring for other reasons which causes a leak that results in a different luminance level (e.g., a point defect occurring due to a foreign object present in the active matrix liquid crystal panel) can similarly be detected. Furthermore, any display unevenness due to non-uniform thickness of a color filter used for a color active matrix liquid crystal panel can also be detected based on the difference in luminance. Moreover, any disruption in signal lines and the like can also be detected since no display is made by such disrupted portions.

The application of the method of the present invention is not limited to active matrix liquid crystal panels of the normally-white mode, but the method can also be applied to active matrix liquid crystal panels of the normally-black mode. Furthermore, the application of the method of the present invention is not limited to the above-mentioned color active matrix liquid crystal panel, but the method can also be applied to monochrome active matrix liquid crystal panels.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for detecting a defect in a color active matrix liquid crystal panel having signal lines and pixel electrodes grouped by threes to display colors, the method comprising the steps of:

(a) inputting a first data signal having an absolute value greater than 0 volt for displaying an image having a luminance level lower than a maximum luminance level to a first signal line of each group of three signal lines, while inputting a second and a third data signal for displaying a black image to a second signal line and a third signal line, respectively, of each of the group of three signal lines, the second signal line and the third signal line adjoining the first signal line, thereby causing pixels corresponding to the first signal line to display a signal color, and (b) detecting a defect in the liquid crystal panel by observing a pixel displaying an unintended color while inputting the data signal of step (a).

2. A method according to claim 1, wherein each data signal is input via a test line, the test lines being disposed so as to intersect signal line extension portions of the signal lines.

3. A method according to claim 2, wherein the test lines are electrically connected to or disconnected from signal line extension portions in such a manner that each signal line extension portion is connected to only one of the test lines.

4. A method according to claim 1, wherein the voltage of the first data signal for displaying the image having a luminance level lower than the maximum luminance level is an absolute value greater than about 0 V and less than about 3.5 V.

5. A method according to claim 4, wherein the voltage of the first data signal for displaying the image having a luminance level lower than the maximum luminance level is in the range of an absolute value of about 0.8 V to an absolute value of about 2.0 V.

6. A method according to claim 1, wherein the defect is a S-D leak defect occurring between a pixel electrode and the corresponding signal line, or a point defect occurring due to the pixel electrode being short-circuited with a signal line other than the corresponding signal line.

7. A method for detecting defects in a color active matrix liquid crystal panel having signal lines and associated pixels grouped by threes for displaying colors, the method comprising the steps of:

(a) applying a first data signal having an absolute value greater than 0 volt for displaying a first color having a luminance level lower than a maximum luminance level to a first signal line of each of the group of three signal lines;

(b) applying second and third data signals to second and the third signal lines, respectively, of each of the group of three signal lines to display a black color in second and third pixels in each group of three pixels;

(c) detecting a defect in any of the first pixels that do not display a first color in step (b);

(d) repeating steps (a) to (c) for the second and third signal lines and associated second and third pixels.

* * * * *